United States Patent
Inoue et al.

(10) Patent No.: US 6,218,206 B1
(45) Date of Patent: Apr. 17, 2001

(54) METHOD FOR PRODUCING THIN FILM TRANSISTOR AND THIN FILM TRANSISTOR USING THE SAME

(75) Inventors: Kazunori Inoue; Masaru Aoki; Munehito Kumagai; Shigeaki Noumi; Tohru Takeguchi, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/153,332

(22) Filed: Sep. 15, 1998

(30) Foreign Application Priority Data

Mar. 31, 1998 (JP) .................................................. 10-086291

(51) Int. Cl.[7] .............................. H01L 21/00; H01L 21/20
(52) U.S. Cl. ............................. 438/30; 438/158; 438/159
(58) Field of Search .............................. 438/30, 158, 159

(56) References Cited

U.S. PATENT DOCUMENTS

| | | | |
|---|---|---|---|
| 5,243,202 | * 9/1993 | Mori et al. | 257/59 |
| 5,686,326 | * 11/1997 | Kitahara et al. | 437/50 |
| 5,879,958 | * 3/1999 | Kawahata et al. | 438/30 |
| 5,895,935 | * 4/1999 | Yamazaki et al. | 438/149 |
| 5,966,589 | * 10/1999 | Watanabe et al. | 438/30 |
| 5,976,902 | * 11/1999 | Shih | 438/30 |
| 5,998,229 | * 12/1999 | Lyu et al. | 438/30 |
| 6,008,065 | * 12/1999 | Lee et al. | 438/30 |
| 6,020,225 | * 2/2000 | Ishiu | 438/166 |
| 6,038,003 | * 3/2000 | Kim | 438/158 |

FOREIGN PATENT DOCUMENTS

| | | |
|---|---|---|
| 1-253715 | 10/1989 | (JP) . |
| 4-257826 | 9/1992 | (JP) . |
| 9-127553 | 5/1997 | (JP) . |
| 9-258247 | 10/1997 | (JP) . |

* cited by examiner

Primary Examiner—Vu A. Le
Assistant Examiner—Michael S. Lebentritt
(74) Attorney, Agent, or Firm—Oblon, Spivak, McClelland, Maier & Neustadt, P.C.

(57) ABSTRACT

To provide a method of producing a TFT array and a liquid crystal display apparatus in which a contact resistivity of a pixel electrode and a drain electrode through a contact hole in an interlayer insulating film can be not more than 10E4Ω stably. A method of producing TFT of the present invention for a liquid crystal display apparatus includes the step of forming TFT, the step of forming an interlayer insulating film, in which the surface is made to be flat so that a level difference due to the TFT area is eliminated, on a transparent insulating substrate, the step of providing a contact hole on a drain electrode of the interlayer insulating film so as to forming a pixel electrode on the interlayer insulating film so that the pixel electrode is electrically connected with the drain electrode through the contact hole, and the step of after forming the contact hole on the interlayer insulating film, applying a surface treatment for cleaning the surface of the contact portion to the surface of the substrate including the surface of the drain electrode exposed from the contact hole.

25 Claims, 7 Drawing Sheets

METHOD FOR PRODUCING THIN FILM TRANSISTOR AND THIN FILM TRANSISTOR USING THE SAME

BACKGROUND OF THE INVENTION

The present invention relates to a method for producing switching elements used in an active matrix liquid crystal display apparatus and to a liquid crystal display apparatus produced by the method.

A liquid crystal display apparatus which is one of a flat panel display instead of CRT has been studied enthusiastically, and it has been practically used as a display apparatus for a microtelevision driven by battery and for a notebook-type personal computer by utilizing a characteristic that its power consumption is small and such an apparatus is thin.

As a method of driving a liquid crystal display apparatus, an active matrix TFT array, in which a TFT (thin film transistor) is used as a switching element, is mainly used from the aspect of high display quality.

It is effect for lowering power consumption of a liquid crystal display apparatus to increase an effective display area of a pixel portion in a liquid crystal panel, namely, to heighten an aperture ratio of the pixels.

As an effective TFT array for obtaining a liquid crystal panel with high aperture ratio, Japanese Examined Patent Publication No. 2521752, Japanese Examined Patent No. 2598420 and Japanese Unexamined Patent Publication No. 163528/1992, for example, disclose an arrangement that after a TFT composed of a scanning electrode, signal electrode and semiconductor layer is formed, an interlayer insulating film composed of transparent insulating synthetic resin is provided over the TFT, and an pixel electrode is formed as the topmost layer.

The high aperture ratio is obtained by the aforementioned arrangement due to following two points. Namely, as explained in Japanese Examined Patent Publication No. 2521752, since a pixel electrode is formed on an interlayer insulating film whose surface is made to be flat by a transparent insulating synthetic resin film, improper display (domain phenomenon) due to disordered alignment of liquid crystal molecules occurring in a level difference portion of the pixel electrode in the conventional arrangement can be eliminated, so an effective display area can be increased. Further, as explained in Japanese Patent Publication No. 2598420 and Japanese Unexamined Patent Publication No. 163528/1992, by forming the pixel electrode on a comparatively thick interlayer insulating film with thickness of 0.3 $\mu$m to 2 $\mu$m, electric short circuit does not occur between gate wiring/source wiring under the interlayer insulating film and the pixel electrode, so the electrode pixel can be formed with a wide area so as to be overlapped on the wirings.

The process for realizing the TFT array arrangement with high aperture ratio such as a method of forming the interlayer insulating film made of transparent insulating synthetic resin is described in detail in Japanese Unexamined Patent Publication No. 96837/1997, Japanese Unexamined Patent Publication No. 127553/1997 and Japanese Unexamined Patent Publication No. 152625/1997.

The producing steps of the TFT array with high aperture ratio are described briefly. TFT composed of a gate electrode, gate insulating film and semiconductor layer, a source electrode and a drain electrode are successively formed on a transparent insulating substrate like glass. Next, an interlayer insulating film made of transparent insulating synthetic resin is formed, and a contact hole (or contact via) is formed. Finally, a pixel electrode is formed, and thus the TFT array is finished. The pixel electrode is electrically connected with the electrode thereunder through the contact hole formed in the interlayer insulating film.

As described in Japanese Examined Patent Publication No. 127553/1997 and Japanese Examined Patent Publication No. 152625/1997, for example, there exist two types of the methods of forming the contact hole in the interlayer insulating film: the method using photosensitive transparent resin and the method using non-photosensitive transparent resin.

In the case of using photosensitive transparent resin, a desired contact hole is formed by the same step as photolithography in which after resin is applied and baked, it is exposed and developed by using a mask pattern of a contact hole. Meanwhile, in the case of using non-photosensitive transparent resin, after resin is applied and baked, a resist is applied and a contact pattern is formed by photolithography, and dry etching is performed by gas including at least one of $CF_4$, $CF_3$ and $SF_6$ so that a desired contact hole is obtained by removing the resist.

Needless to say, in the case of using photosensitive resin, a contact hole may be formed by dry etching using a resist mask. Moreover, a material of the transparent insulating synthetic resin film may be an organic material or inorganic material.

It is necessary for display quality in the above TFT array with high aperture ratio that the electrical connection between the pixel electrode on the upper layer and the drain electrode on the lower layer through the contact hole in the interlayer insulating film is satisfactory. The satisfactory electric connection is represented generally by contact resistivity of the pixel electrode and drain electrode on the surface of the contact hole, and the contact resistivity per aperture area of 50 $\mu$m□ should be not more than 10E4$\Omega$ (hereinafter, the value of the contact resistivity is a value per aperture ratio of 50 $\mu$m□ as long as no explanatory note).

However, in the conventional process for the TFT array with high aperture ratio using the interlayer insulating film made of transparent resin, it is difficult to stably obtain the value of the contact resistivity of not more than 10E4$\Omega$, so there arises a problem that yield is lowered.

In particular, since the contact hole for connecting the pixel electrode with the drain electrode is formed in a whole pixel portion where the pixels are arranged in matrix pattern on the substrate, even if improper contact resistivity occurs partially on the substrate, improper display occurs, and thus the yield is lowered. Therefore, it is very important that the step for forming the contact hole which stably provides low contact resistivity is realized.

However, the method of forming the contact via in the interlayer insulating film which provides stably low contact resistivity is not concretely disclosed in the aforementioned patent publications. Moreover, such a method is not described also in another relating patent documents.

It is an object of the present invention to provide a method of producing a TFT array which is capable of solving the above problem and of stably maintaining the value of contact resistivity of a pixel electrode and drain electrode through a contact hole in an interlayer insulating film at not more than 10E4$\Omega$ in a TFT array with high aperture ratio using the interlayer insulating film made of transparent resin, and relates to a liquid crystal display apparatus produced by this method.

SUMMARY OF THE INVENTION

As a result of examining the factor which increases the value of the contact resistivity using a transparent insulating synthetic resin film made of an inorganic material as an interlayer insulating film, it was discovered that in the case where the contact resistivity is large, materials including oxygen and carbon existed on the contact surface between the pixel electrode and drain electrode.

Namely, these materials are mainly components of the transparent insulating synthetic resin film, and it was found that they were generated because of:

(1) residue of the transparent insulating synthetic resin film after forming the contact hole; and (2) decomposed matter of the transparent insulating synthetic resin film at the time of forming the pixel electrode, but these (1) and (2) are new knowledge which is different from the case of the conventional TFT array substrate.

Therefore, in order to stably obtaining satisfactory contact resistivity, the residue of (1) and the decomposed matter of (2) should not be generated. In another way, if they are generated, the contact surface may be cleaned by a process which can eliminate them.

From these aspects, the method of producing a thin film transistor according to the present invention is characterized by comprising the steps of:

successively forming a gate electrode, gate insulating film, semiconductor layer, source electrode and drain electrode on a transparent insulating film;

forming an interlayer insulating film composed of a transparent insulating synthetic resin film so as to cover the gate electrode, gate insulating film, semiconductor layer, source electrode and drain electrode;

forming a contact hole; and applying a surface treatment to the whole surface of the substrate of a connection electrode to be connected with a lower drain electrode exposed from the contact hole portion or with the drain electrode by one of or both of physical and chemical methods for producing an effect that the surface of the contact portion is cleaned. By this surface treatment, residue of the transparent insulating synthetic resin film can be eliminated from the contact hole, and satisfactory contact resistivity can be realized.

As for the physical surface treatment applied to the interlayer insulating film after forming the contact hole, at least one treatment is selected from a hydrogen plasma treatment, helium plasma treatment and nitrogen plasma treatment. By performing the surface treatment, the residue of the transparent insulating synthetic resin film can be eliminated from the surface of the contact hole by impact of plasma ion. Further, the restraint of thermal cracking in the transparent insulating synthetic resin film, which is brought by the effect that the surface treatment improves the surface of the transparent insulating synthetic resin, also produces an effect that generation of resin degradation products at the time of forming a pixel electrode film is restrained.

Meanwhile, as for the physical surface treatment applied to the interlayer insulating film after forming the contact hole, in the case where the oxygen plasma treatment is used, besides an advantage that eliminates the residue of the transparent insulating synthetic resin film from the surface of the contact hole due to the impact of the plasma ion, the surface treatment occasionally changes a property of the surface of the transparent insulating synthetic resin, to cause acceleration of the thermal cracking. In this case, before applying the surface treatment, only the contact portion remains and the whole surface of the transparent insulating synthetic resin film is covered with a resist, and after the surface treatment, the resist is removed. As a result, only the contact surface can be cleaned without influencing the transparent insulating synthetic resin film. Needless to say, this method is effective in the case where the hydrogen plasma treatment, helium plasma treatment and nitrogen plasma treatment are used.

In addition, as for another physical surface treatment applied to the interlayer insulating film after forming the contact hole, at least one treatment is selected from hydrogen ion implantation, boron ion implantation, nitrogen ion implantation, phosphorus ion implantation. By the ion implantation, the residue of the transparent insulating synthetic resin film due to the impact of ion can be eliminated from the surface of the contact hole. Further, restrain of thermal cracking in the resin due to a change in the quality of the surface of the transparent insulating synthetic resin, which is brought by the ion implantation, also produces an effect that generation of resin degradation products at the time of forming a pixel electrode film can be restrained.

Here, after the whole surface of the transparent insulating synthetic resin film other than the contact surface is covered with a resist, the ion implantation treatment is applied, and the resist can be removed. In this case, only the surface of the contact hole can be cleaned without influencing the transparent insulating synthetic resin film.

In addition, as for another physical surface treatment, a method of subjecting the surface to light-etching by the dry etching using gas applicable to the material of the lower drain electrode to be connected with the pixel electrode is used. Moreover, this method may be combined with the plasma treatment or ion implantation treatment.

Next, as for the chemical surface treatment applied to the interlayer insulating film after forming the contact hole, the method of subjecting the surface to light-etching using chemical agent which can etch the material of the drain electrode is used. The lift-off due to the etching of the drain electrode can eliminate the residue of the transparent insulating synthetic resin film from the contact surface.

In this case, after the whole surface of the transparent insulating synthetic resin film other than the contact surface is covered with a resist, the chemical surface treatment is applied, and the resist can be removed. In this case, only the surface of the contact hole can be cleaned without the effect of the chemical agent on the surface of the transparent insulating synthetic resin film.

The aforementioned physical and chemical surface treatment applied to the whole surface of the substrate including the contact surface makes it possible to obtain the TFT array substrate which is characterized in that a thickness of the lower drain electrode of the contact hole portion is thinner than a thickness of the lower drain electrode of the other portion. This effect becomes remarkable particularly in the cases where the dry etching is subjected by using dry etching gas as the physical surface treatment and where the chemical surface treatment is subjected.

Further, in the method of producing a thin film transistor according to the present invention, in the formation of a pixel electrode, after a transparent conductive film is deposited by the sputtering method or the like, a heat treatment is applied at a temperature which is in a range of 150° C. to 250° C. and is not less than the substrate temperature at the time of the deposition. The heat treatment improves adhesion with the lower drain electrode in the portion of the contact hole, and thus satisfactory contact resistivity can be obtained. Moreover, the heat treatment produces an effect that specific resistance and transmittance of the transparent conductive film are improved and an effect that a stress of the whole TFT array substrate is relaxed and the electrical property is improved. Further, since the heat treatment improves the property, the substrate temperature at the time of depositing the transparent conductive film can be set for not more than 250° C., and as a result, degradation products of the interlayer insulating film can be restrained.

Further, in the method of producing a thin film transistor according to the present invention, before the interlayer insulating film made of transparent insulating synthetic resin is formed, a silicon nitride film which protects the channel section of the TFT is formed. As a result, the electric property of TFT can be stabilized.

There are some kinds of methods of forming a contact hole in the double-layered interlayer insulating film made of transparent insulating synthetic resin and silicon nitride.

(1) A method of forming a contact hole in which a contact hole is previously formed on silicon nitride by dry etching or the like using a resist mask, and after the resist mask is removed, a transparent insulating synthetic resin film is formed.

(2) A method of forming a contact hole in which a silicon nitride film and a transparent insulating synthetic resin film are formed successively and a contact hole is formed on the transparent insulating synthetic resin film, and dry etching is subjected by using the transparent insulating synthetic resin film, in which the contact hole was formed, as a mask so that the contact hole is formed in the silicon nitride film. In this method, in the case where a photosensitive transparent insulating synthetic resin film is used, the contact hole can be formed in the transparent insulating synthetic resin film by the same exposing/developing method as photolithography.

(3) A method of forming a contact hole in which a silicon nitride film and transparent insulating synthetic resin film are formed successively, and the transparent insulating synthetic resin film and silicon nitride film are etched successively by dry etching using a resist mask produced by photolithography so that the contact hole is formed. This method can be applied to both the cases where the transparent insulating synthetic resin film is photosensitive and non-photosensitive.

In any methods, by subjecting to physical or chemical surface treatment after forming a contact hole, satisfactory contact resistivity can be obtained.

Here, in the method (3), by subjecting to the surface treatment with the resist mask, only the surface of the contact hole portion can be easily cleaned without influencing the transparent insulating synthetic resin film.

Further, in the method of producing a thin film transistor according to the present invention, as a drain electrode, at least one material is used by selecting from Al, Cr, Cu, Mo and Ta or metal alloy mainly containing these metals, as the material of a pixel electrode, at least one material is used by selecting indium oxide, tin oxide and ITO (Indium Tin Oxide). As a result, the satisfactory contact resistivity can be obtained.

A liquid crystal display apparatus of the present invention includes a TFT array substrate, in which TFT is formed in a matrix pattern in the vicinity of a cross section of gate wiring and source wiring produced by the aforementioned producing method of the present invention, and a counter substrate which sandwiches liquid crystal with the TFT array substrate and which has a counter electrode color filter. For this reason, the liquid crystal display apparatus with high aperture ratio can be produced with excellent yield.

DETAILED DESCRIPTION

The following further describes in detail embodiments of the present invention on reference to the drawings.

EMBODIMENT 1

The following describes one embodiment of the present invention on reference to the drawings.

Figure 1A:
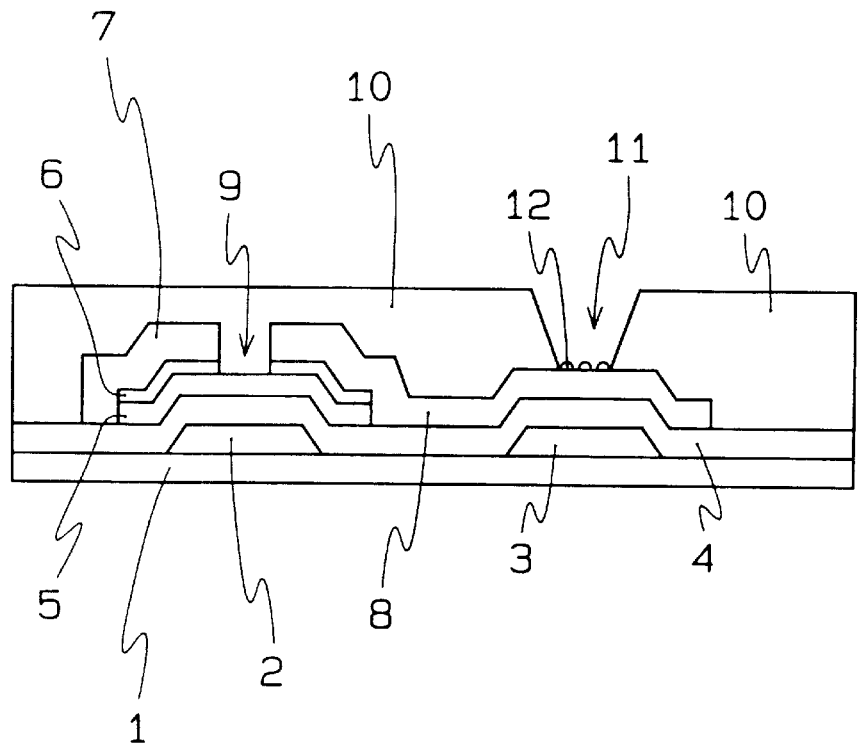
FIGS. 1(a) and 1(b) are each schematic sectional view explaining a TFT according to one embodiment of the present invention.
Figure 1B:
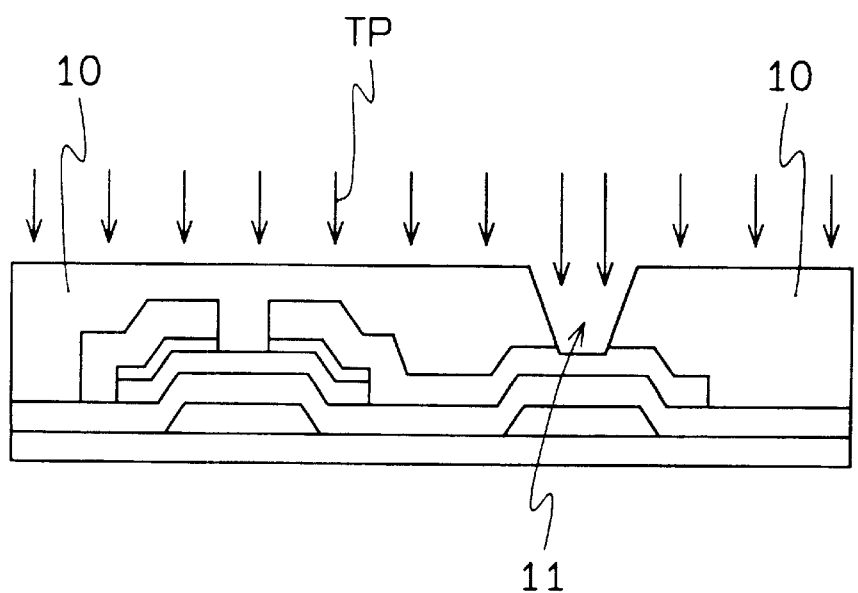
Figure 2:
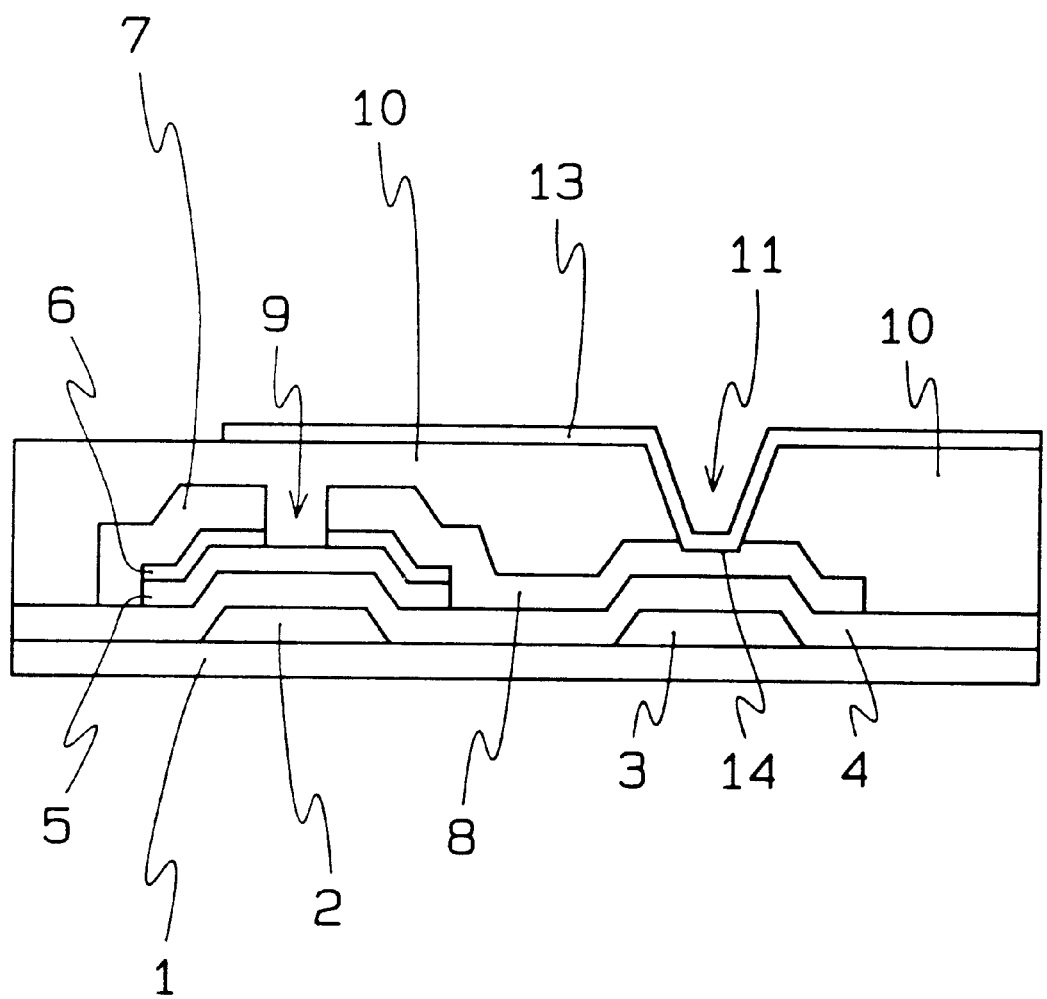
FIG. 2 is a schematic sectional view explaining the TFT according to one embodiment of the present invention.

FIGS. 1(a) to 1(b) and 2 are schematic sectional views explaining a method of producing a TFT array substrate according to embodiment 1 of the present invention. In FIGS. 1(a) to 1(b) and 2, numeral 1 is a transparent insulating substrate, numeral 2 is a gate electrode, numeral 3 is a common electrode, numeral 4 is a gate insulating film, numeral 5 is an a-Si film, numeral 6 is a n$^+$-a-Si film, numeral 7 is a source electrode, numeral 8 is a drain electrode, numeral 9 is a channel section, numeral 10 is an interlayer insulating film, numeral 11 is a contact hole, numeral 12 is residue on a contact hole surface, numeral 13 is a pixel electrode, and numeral 14 is a contact surface. Moreover, reference symbol TP represents physical surface treatment.

First, as shown in FIG. 1(a), Cr is deposited on the transparent insulating glass substrate 1 made of glass or the like by sputtering method, and the gate electrode 2 and common electrode 3 are formed by photolithography method.

Next, the gate insulating film 4 made of silicon nitride, amorphous silicon (hereinafter, referred to as a-Si) 5, low-resistant amorphous silicon (hereinafter, referred to as n$^+$a-Si) 6 are deposited successively by plasma CVD method or the like, and the a-Si film 5 and n$^+$a-Si film 6 are patterned by photolithography method so that a semiconductor layer is formed.

Next, Cr is deposited by sputtering method or the like, and the channel section 9 in the semiconductor layer, source electrode 7 and drain electrode 8 are formed by photolithography method so that the TFT is formed.

Further, a photosensitive acrylic transparent resin is applied and baked by the spin coating method or the like so that a level difference portion due to TFT is eliminated and the surface becomes flat, and the interlayer insulating film is formed thereon. Thereafter, the contact hole 11 is formed so that a part of the surface of the drain electrode is exposed by the exposing/developing process using the photolithography method. At this time, a granular or uniform thin-film-type foreign matter remains as residue on the surface of the opening of the contact hole. The main component of the most of the residue in this case is the interlayer insulating film 10.

Next, as shown in FIG. 1(b), the whole surface of the interlayer insulating film 10 including the contact hole 11 is subject to the surface treatment using physical method. In this embodiment, several types of the processes shown in Table 1 were performed. As a result, the residue on the surface of the contact hole is eliminated nearly completely.

Finally, as shown in FIG. 2, The temperature of the substrate surface was set to 200° C., and a transparent conductive film ITO (Indium Tin Oxide) composed of indium oxide and tin oxide was deposited so as to have a film thickness of 1000 Å by sputtering method. Thereafter, the heat step was performed in such a manner that the transparent conductive film was maintained at 230° C. for 60 minutes, and it was patterned by lithography method and a pixel electrode 13 was formed so that a desired TFT array substrate for a liquid crystal display apparatus was obtained.

Pixel electrode 13 is electrically connected with drain electrode 8 on contact surface 14 of contact hole 11.

The contact resistivity in pixel electrode 13 and drain electrode 8 on contact surface 14 of the TFT array are, as shown in Table 1, not more than several 10E4Ω, namely, they are reduced more greatly than the case of no surface treatment, i.e., 10E8Ω.

the film thickness on the other portion (light etching). Here, the dry etching process may be combined with the surface treatments shown in Table 1.

In addition, it is not necessary that gate electrode 2, common electrode 3, source electrode 7 and drain electrode 8 are made of the same metallic material, so different metallic materials are combined by selecting the aforementioned metallic materials. On the other hand, as pixel electrode 13, besides the ITO film, an indium oxide film, tin oxide film, zinc oxide film, and the other transparent conductive film may be used.

In the aforementioned combinations of the materials, according to the present embodiment of the present invention, the contact resistivity on contact surface 14 can obtain a low value, i.e., not more than 10E3Ω.

Here, it is preferable that when the transparent conductive film is deposited at the time of forming pixel electrode 13, the temperature on the substrate surface is set for less than 250° C. This is because, as shown in Table 2, when the temperature of the substrate is set for more than 245° C.±5° C., even if the physical process is performed on the contact

TABLE 1

(physical surface treatment and contact resistivity)

| | plasma treatment | | | | contact resistivity |
|---|---|---|---|---|---|
| kind of gas | mode | power (W) | pressure of gas (Pa) | time (second) | (Ω/50 μm□) |
| $N_2$ | (1) (2) PEorRIE | 500 to 1500 | 7 to 100 | 15 to 300 | 500 to $1.6 \times 10^4$ |
| He | PEorRIE | 500 to 1500 | 7 to 100 | 15 to 300 | 500 to $1.6 \times 10^4$ |
| $O_2$ | PEorRIE | 500 to 1500 | 7 to 250 | 15 to 250 | 50 to $2.3 \times 10^3$ |
| | ion implantation (doping) | | | | contact resistivity |
| kind of ion | accelerated voltage (keV) | | dose (1/cm³) | | (Ω/50 μm□) |
| B, P, N, H | 5 to 10 | | $1 \times 10^{15}$ to $1 \times 10^{17}$ | | $1.0 \times 10^3$ to $3.6 \times 10^4$ |
| | no surface treatment | | | | $1.0 \times 10^6$ to $3.6 \times 10^9$ |

Note
(1) PE: Plasma Etching
(2) RIE: Reactive Ion Etching

Since the process conditions of the physical surface treatments shown in Table 1 are different in an optimum value according to apparatuses, the most suitable process condition may be set according to individual apparatus, so the values are not limited to the numerical values shown in Table 1 in the present invention.

In the present embodiment, Cr as gate electrode 2 and common electrode 3, and Cr as source electrode 7 and drain electrode 8 were used, but the materials are not limited to them, so Al, Cu, Mo and Ta, for example, can be used. It is preferable that these materials are used because electrodes and wiring in which the specific resistance is low, i.e., 25 μΩ·cm can be realized.

As the physical treatment, besides the method shown in Table 1, for example, the dry etching process may be performed in such a manner that in the case where drain electrode 8 is made of Cr, gas such as $CCl_4+O_2$ is used, and in the case where drain electrode 8 is made of Mo and Ta, gas such as $CCl_4+O_2$ is used in case where drain electrode 8 is made of Al, gas such as $BCl_3+Cl_2$ is used, and in case where drain electrode 8 is made of Cu, gas such as Ar is used. The dry etching process is completed before the film of contact hole 11 of drain electrode 8 is finished completely, but it is preferable that the process thereon is finished with not less than ½ of a film thickness remaining compared with hole surface in the present embodiment, the contact resistivity is increased to not less than 10E6Ω.

TABLE 2

| Temperature of the substrate to be set at the time of depositing ITO | Contact resistivity (Ω/50 μm□) |
|---|---|
| 70 ± 5 | $3.0 \times 10^2$ to $3.0 \times 10^3$ |
| 205 ± 5 | 50 to $3.0 \times 10^3$ |
| 225 ± 5 | 50 to $3.0 \times 10^3$ |
| 245 ± 5 | $8.0 \times 10^6$ to $5.0 \times 10^8$ |

This is because when the temperature of the substrate surface exceeds 250° C., pyrolysis occurs in the interlayer insulating film 10, and a product of the pyrolysis is caught by the vicinity of contact surface 14 at the time of initial depositing ITO, and thus the ITO film is deposited.

Further, when pyrolysis occurs in the interlayer insulating film, there arises a problem that change in color occurs and thus transmittance is deteriorated. Accordingly, it is preferable that the temperature of the substrate surface at the time of depositing the transparent conductive film of the pixel electrode is set for less than 250° C.

However, when the temperature of the substrate at the time of depositing the transparent conductive film is lowered, adhesion is lowered, and thus removal occurs at the time of patterning, and the contact resistivity is increased due to lifting of the ITO film caused by the removal on contact surface 14. This phenomenon is caused easily when the temperature of the substrate surface is less than 150° C. Therefore, after ITO film is deposited, it is preferable that the heat treatment is subjected at the temperature which is not less than the temperature of the substrate surface at the time of deposition and at least not less than 150° C. It is preferable that the heat treatment temperature is not more than 250° C. due to the problem of the pyrolysis of the interlayer insulating film.

Here, as for the electrical connection between the drain electrode and pixel electrode ITO, in some cases, a connection electrode connected with the drain electrode is provided, and electrical contact with ITO is obtained through the contact hole in the interlayer insulating film formed on the surface of the connection electrode. In this case, the same effect as the present invention can be obtained by applying the surface treatment on the contact hole of the connection electrode in the similar manner as embodiment 1 (in embodiments 2 through 5, the same effect can be obtained). The TFT array substrate formed in the above manner is combined with a counter substrate similar to the conventional one, and a liquid crystal material is interposed between these substrates so that a liquid crystal display apparatus is obtained. The gate wiring and source wiring are provided on the TFT array substrate in the same manner as the conventional one, and TFT of the present invention is formed in a matrix pattern on the vicinity of the cross section of the gate wiring and source wiring. Moreover, a counter electrode and a color filter are provided to the counter substrate.

EMBODIMENT 2

Figure 3A:
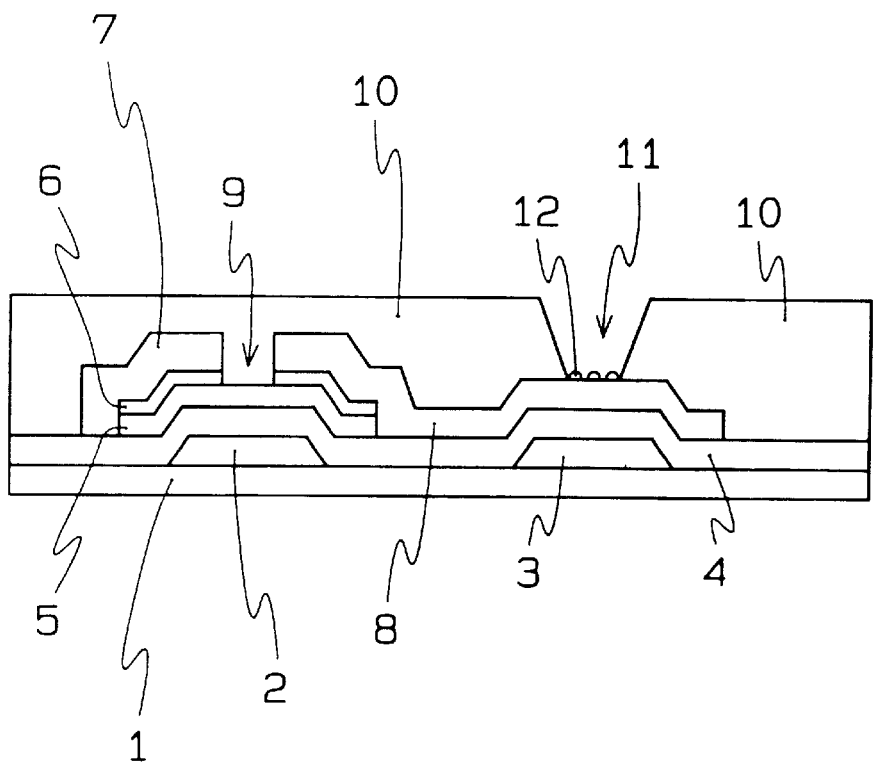
FIGS. 3(a) and 3(b) are each schematic sectional view explaining the TFT according to another embodiment of the present invention.
Figure 3B:
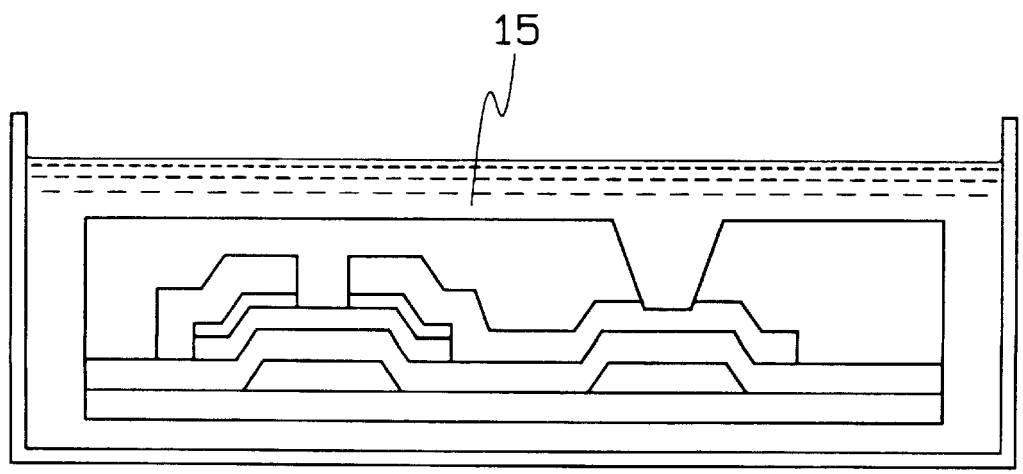
Figure 4:
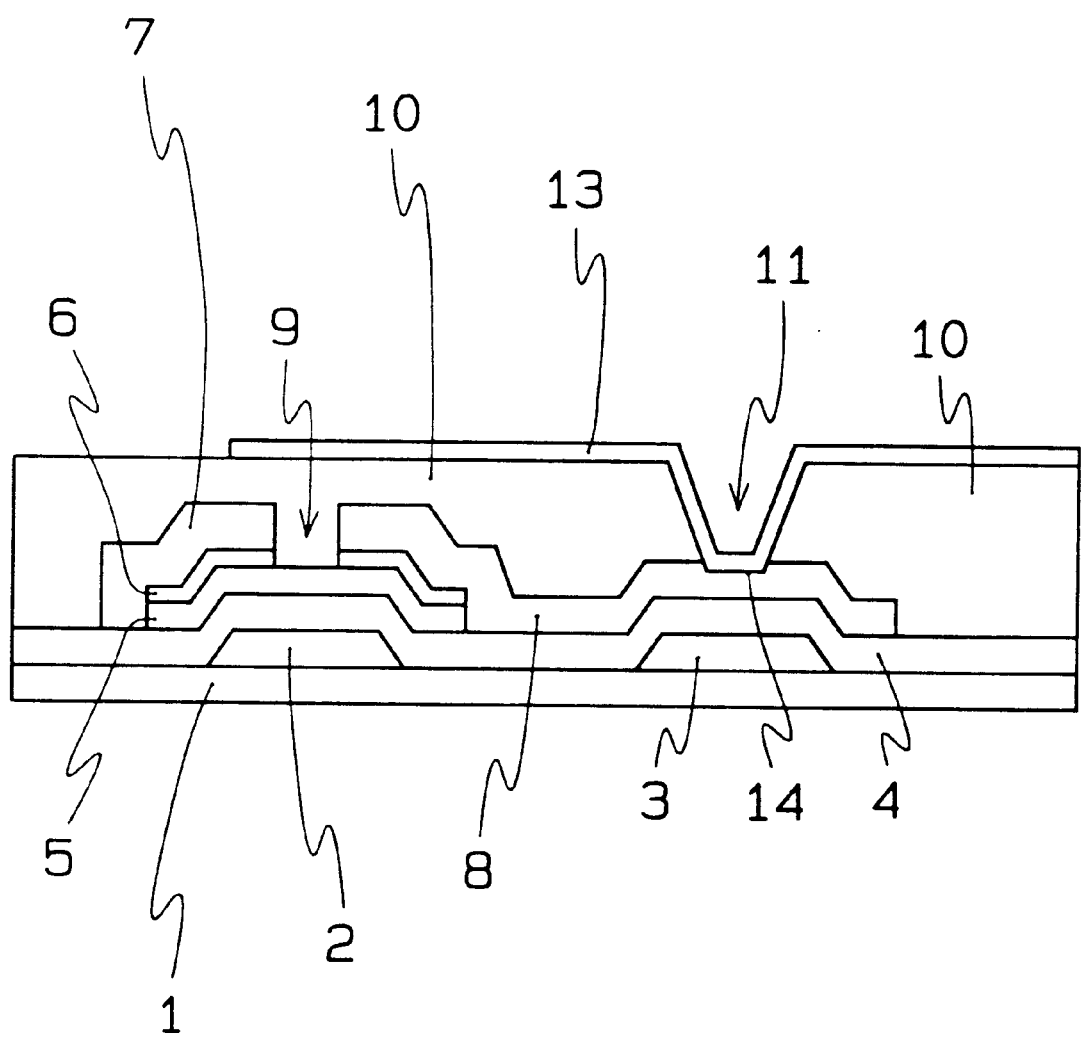
FIG. 4 is a schematic sectional view explaining the TFT according to another embodiment of the present invention.

FIGS. 3(a) to 3(b) and 4 are schematic sectional views explaining a method of producing the TFT array substrate according to embodiment 2 of the present invention. Here, in FIG. 3, 15 is chemical agent, and the other portions same as those shown in FIGS. 1(a) to 1(b) and 2 are represented by the same reference numerals.

In the present embodiment, the processes other than the surface treatment on the whole surface of interlayer insulating film 10 provided with contact hole 11 using a chemical method are the same as those in embodiment 1 shown in FIGS. 1(a) to 1(b).

Namely, the substrate shown in FIG. 3(a) according to the present embodiment is formed by the same process as FIG. 1(a) in embodiment 1.

Next, as shown in. FIG. 3(b), the substrate is dipped in the chemical agent 15 composed of cerium ammonium nitrate, perchloric acid and water, and the chemical surface treatment is applied to the By this treatment, a portion exposed from the surface of contact hole 11 of drain electrode 8 made of Cr is etched, and a foreign matter 12 remaining on the surface of the contact hole is simultaneously eliminated by lift-off.

The surface treatment using the chemical agent is finished before drain electrode 8 of the contact hole is etched completely, but it is preferable that this treatment is finished with a thickness of the other portion, which is at least ½ of the thickness of drain electrode 8, remaining.

Finally, after the processes same as those in FIG. 2 according to embodiment 1, the pixel electrode 13 is formed, and the TFT array of the liquid crystal display apparatus shown in FIG. 4 is obtained.

Pixel elect rode 13 is electrically connected with drain electrode 8 through contact surface 14 of contact hole 11, but in the present embodiment, since the surface of the contact hole in drain electrode 8 is eliminated by the chemical etching treatment, the present embodiment is characterized in that the thickness of drain electrode 8 on contact surface 14 is thinner than the thickness of the other portions.

The contact resistivity of pixel electrode 13 and drain electrode 8 on contact surface 14 of the TFT array obtained in such a manner is, as shown in Table 1, several 100E4Ω, namely, the value was lowered more greatly than the value of 10E8Ω in the case where no surface treatment is given.

Here, in the present embodiment, Cr was used as gate electrode 2, common electrode 3, source electrode 7 and drain electrode 8, but the material is not limited to this, so Al, Cu, Mo, etc. can be used. It is preferable that when these materials are used, electrodes and wiring with low specific resistance of 25 $\mu\Omega$·cm can be realized.

Moreover, it is not necessary that gate electrode 2, common electrode 3, source electrode 7 and drain electrode 8 are made of same metallic material, so different metallic materials can be combined by selecting the aforementioned metallic materials.

As for chemical agent 15 used for the chemical surface treatment in FIG. 4, an agent, which can chemically etch the metallic material of drain electrode 8, should be used.

For example, in the case where the drain electrode 8 is made of Al or Mo, an agent made of phosphoric acid, nitric acid, acetic acid and water can be used, in the case of Cu, an agent made of ammonium persulfate and water can be used, and in the case of Ta, an agent made of hydrofluoric acid, nitric acid and water can be used.

On the other hand, as pixel electrode 13, besides the ITO film, an indium oxide film, tin oxide film and the other transparent conductive film may be used.

In the aforementioned combination of the materials, according to the present embodiment of the present invention, the contact resistivity on contact surface 14 can obtain a lower value, i.e., not more than 10E3Ω.

In addition, in embodiment 1, as shown in Table 2, it is preferable that the temperature of the substrate surface at the time of depositing the transparent conductive film of the pixel electrode is set for less than 250° C., and after the deposition, the heat treatment is given at the temperature which is not less than the temperature of the substrate surface at the time of deposition and which is 150° C. to 250° C.

EMBODIMENT 3

Figure 5A:
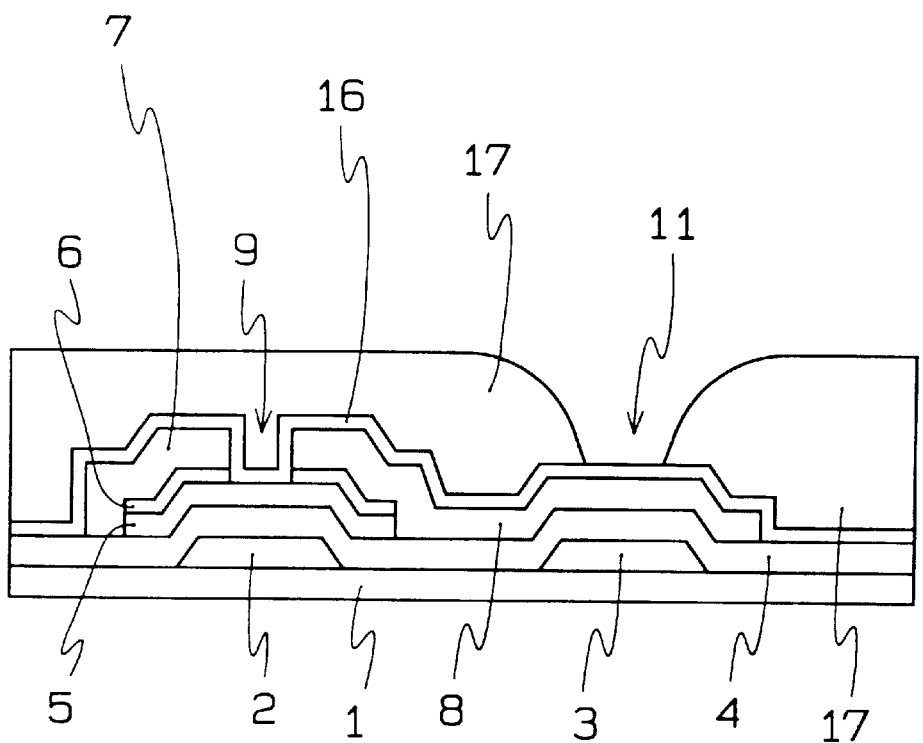
FIGS. 5(a) and 5(b) are each schematic sectional view explaining the TFT according to another embodiment of the present invention.
Figure 5B:
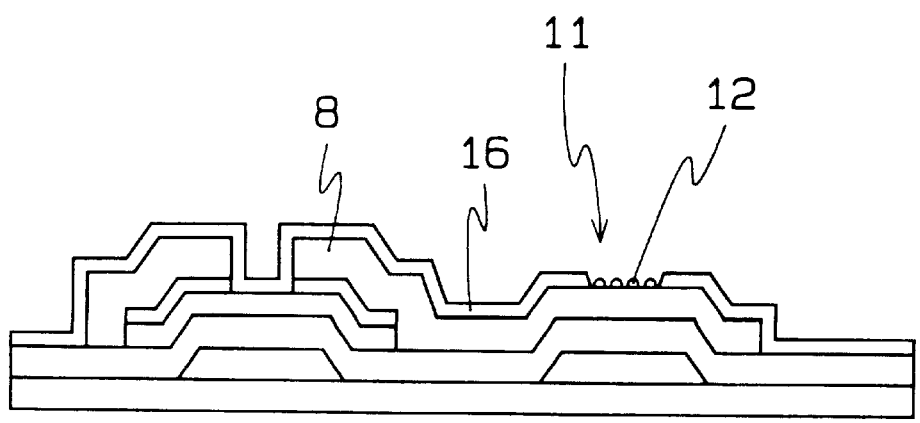

FIGS. 5(a) and 5(b) are each schematic sectional view explaining a method of producing the TFT array substrate according to embodiment 3 of the present invention. In FIGS. 5(a) to 5(b), 16 is a passivation film, 17 is photoresist, and the portions which are the same as those shown in FIGS. 1 through 4 are represented by the same reference numerals.

As shown in FIG. 5(a), the present embodiment is characterized in that before interlayer insulating film 10 composed of transparent insulating synthetic resin is formed, an inorganic insulating film made of silicon nitride is formed by plasma CVD method as passivation film 16. Passivation film 16 composed of the inorganic insulating film protects channel section 9 of the TFT, and thus the characteristic of TFT can be more stable than the case where the interlayer insulating film composed of transparent insulating synthetic resin is directly formed.

Photoresist 17 as a mask is used, and contact hole 11 of passivation film 16 made of silicon nitride, is formed by the dry etching method using $CF_4+O_2$ gas, for example, and thereafter photoresist 17 is removed.

At this time, in the case where Cr, Al and Cu are used for the drain electrode 8, as shown in FIG. 3(b), residue 12 occasionally remains on the drain electrode surface exposed portion of contact hole 11. This is mainly a foreign matter including fluoride generated at the dry etching.

Therefore, as residue 12 on the surface after interlayer insulating film 10 composed of a transparent insulating synthetic resin film is provided as shown in FIG. 1(a) and contact hole section 11 is formed, the residue mainly containing a component of the interlayer insulating film, and the residue mainly containing the fluoride at the time of dry etching remain, but a desired TFT array for the liquid crystal display apparatus with the lower contact resistivity can be obtained by the same processes as those shown in FIGS. 1(b) and 2 of embodiment 2 and in FIGS. 3(b) and 4 in embodiment 2.

Meanwhile, in the case where Mo or Ta is used for drain electrode 8, the surface is subjected to dry etching by $CF_4+O_2$ gas at the time of forming contact hole 11 of said passivation film 16 made of silicon nitride, and thus said residue 12 hardly remains on the surface of the contact hole in FIG. 5(b).

Therefore, as for residue 12 on the surface after interlayer insulating film 10 composed of a transparent insulating synthetic resin film is provided as shown in FIG. 1(a) and contact hole 11 is formed, the residue mainly containing a component of the interlayer insulating film remains.

Thereafter, the TFT array for the liquid crystal display apparatus with desired lower contact resistivity can be obtained by the same processes as those shown in FIGS. 1(b) and 2 of embodiment 1 and in FIGS. 3(b) and 4 of embodiment 2.

EMBODIMENT 4

Figure 6A:
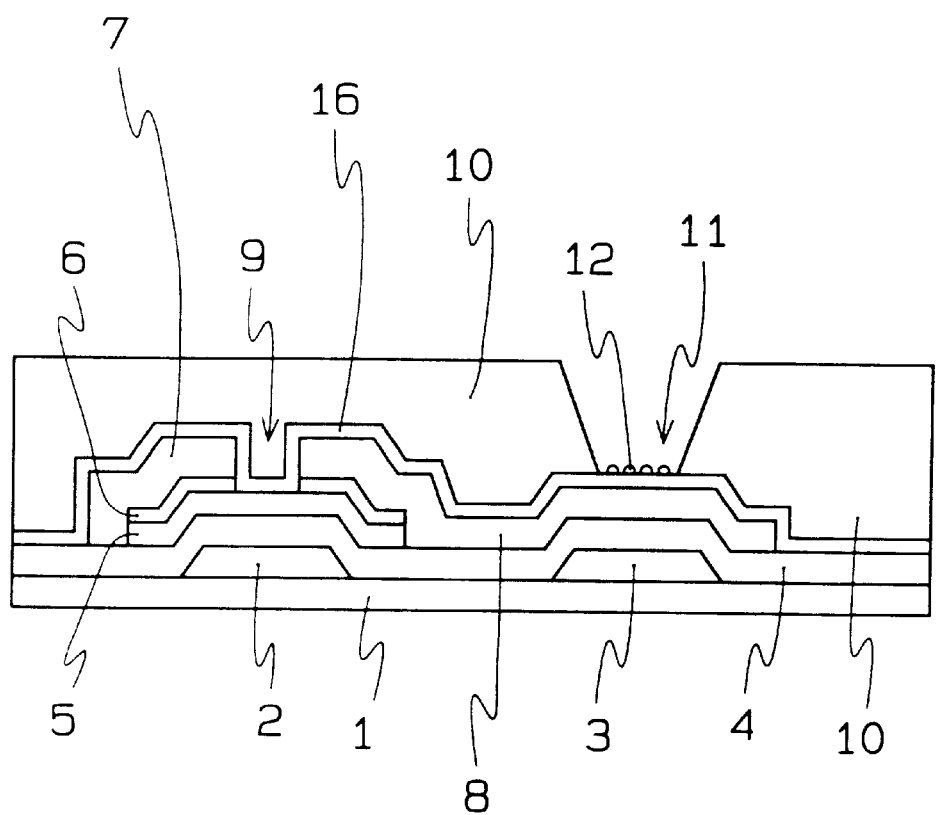
FIGS. 6(a) and 6(b) are each schematic sectional view explaining the TFT according to another embodiment of the present invention.
Figure 6B:
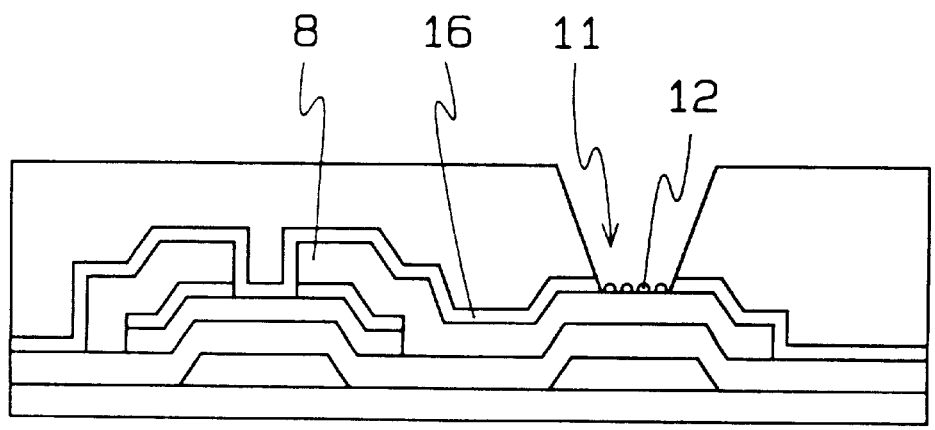

FIGS. 6(a) and 6(b) are each schematic sectional view showing a method of producing the TFT array substrate according to embodiment 4 of the present invention. In FIGS. 6(a) and 6(b), the portions same as those shown in FIGS. 1(a) and 1(b), 2, 3(a) and 3(b), 4, 5(a) and 5(b) are represented by the same reference numerals.

Similarly to embodiment 3, the present embodiment is also characterized in that before interlayer insulating film 10 made of transparent insulating synthetic resin is formed, the inorganic insulating film made of silicon nitride is formed as passivation film 16, but the process of forming the contact hole is different.

As shown in FIG. 6(a), after passivation film 16 made of silicon nitride, for example, is formed by plasma CVD method or the like, the interlayer insulating film composed of a photosensitive transparent insulating synthetic resin film is applied and fired by the spin coating method or the like, and contact hole 11 is formed on interlayer insulating film 10 by the exposing/developing treatment using the photolithography.

Next, interlayer insulating film 10 is masked, and it is etched with silicon nitride by the dry etching method using $CF_4+O_2$ gas, for example.

In the present embodiment, in the case where Cr, Al or Cu is used for drain electrode 8, a foreign matter mainly containing a component of the interlayer insulating film, and a foreign matter mainly containing the fluoride remain as residue 12 on the surface of drain electrode 8 of contact hole 11 shown in FIG. 4(b).

In addition, in the case where Mo and Ta are used for drain electrode 8, the surfaces of Mo and Ta are subjected to dry etching simultaneously at the time of dry etching with silicon nitride using $CF_4+O_2$ gas, so the foreign matter mainly containing the fluoride does not remain. Therefore, only the foreign matter mainly containing the component of the interlayer insulating film remains as residue 12 at the time of the process shown in FIG. 1(a).

In both the cases, a desired TFT array for a liquid crystal display apparatus with lower contact resistivity can be obtained by the same processes shown in FIGS. 1(b) and 2 of embodiment 1 and in FIGS. 3(b) and 4 of embodiment 2.

EMBODIMENT 5

Figure 7A:
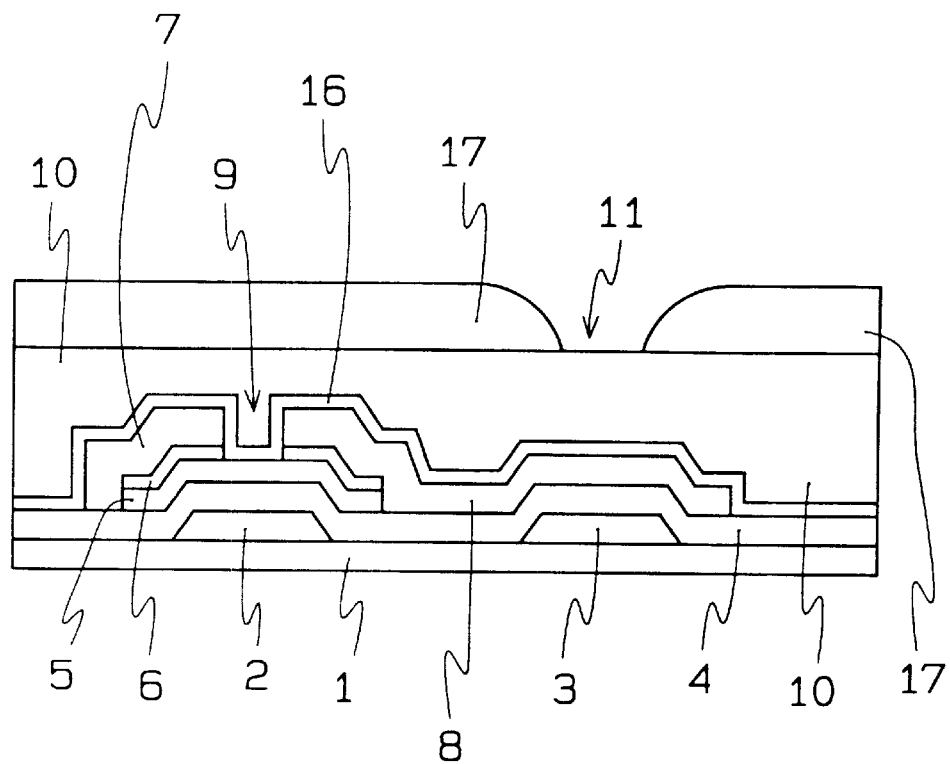
FIGS. 7(a) and 7(b) are each schematic sectional view explaining the TFT according to another embodiment of the present invention.
Figure 7B:
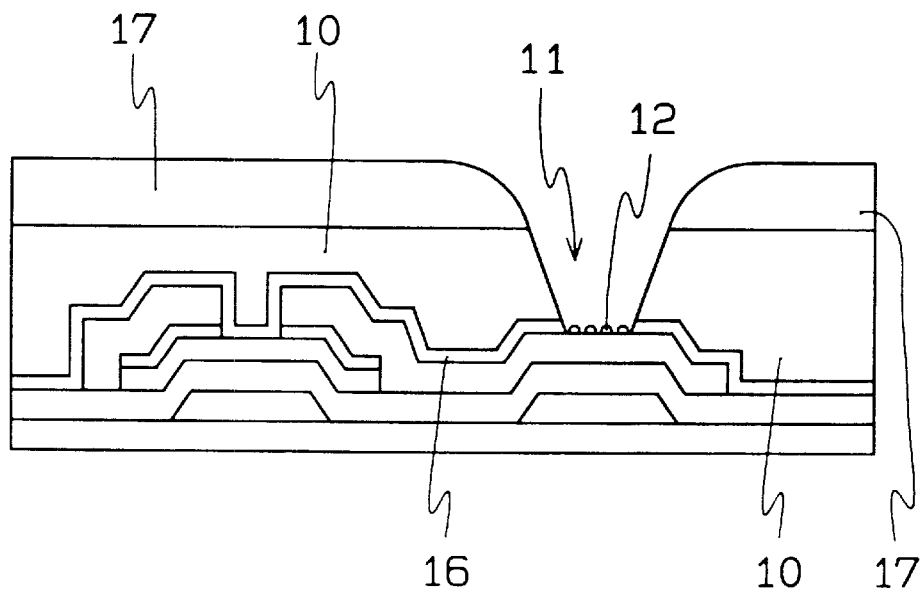

FIGS. 7(a) and 7(b) are each schematic sectional view explaining a method of producing the TFT array substrate according to embodiment 5 of the present invention. In FIGS. 7(a) and 7(b), the portions same as those shown in FIGS. 1(a) to 1(b) through 4 are represented by the same reference numerals.

Similarly to embodiments 3 and 4, the present embodiment is also characterized in that before interlayer insulating film 10 made of transparent insulating synthetic resin is formed, the inorganic insulating film made of silicon nitride is formed as passivation film 16. However, the process of forming the contact hole is different, and in particular, the present embodiment is suitable for the case using non-photosensitive transparent insulating synthetic resin as interlayer insulating film 10.

First, as shown in FIG. 7(a), passivation film 16 made of silicon nitride, for example, is formed by the plasma CVD method, and the interlayer insulating film composed of a non-photosensitive transparent insulating synthetic resin film is formed by applying and firing it by the spin coat method or the like.

Next, photoresist 17 is formed by the photolithography method as a mask for forming contact hole section 11.

Thereafter, photoresist 17 is used as a mask and interlayer insulating film 10 and passivation film are continuously etched by dry etching method using $CF_4+O_2$ gas, for example, and photoresist 17 is removes. At this time, as mentioned above, in the case where Cr, Al and Cu are used as the drain electrode instead of Mo and Ta, a foreign matter mainly containing fluoride occasionally remains as residue 12 on the surface of drain electrode 8 of contact hole section 11 shown in FIG. 6(b).

Thereafter, the desired TFT array for a liquid crystal display apparatus is obtained by the same process as that shown in FIGS. 1(b) and 2 of embodiment 1 and in FIGS. 3(b) and 4 of embodiment 2.

In addition, as another process in the present embodiment, after photoresist 17 is used as a mask and interlayer insulating film 10 and passivation film are successively etched by using $CF_4+O_2$ gas, for example, the physical surface treatment shown in Table 1 and the chemical surface treatment described in embodiment 2 are applied with the photoresist not being removed. Thereafter, photoresist 17 is removed.

By this method, since the surface of the interlayer insulating film 10 other than the surface of contact hole 11 is covered with photoresist 17, the effect of the present invention such that only the surface of the contact hole is cleaned can be obtained without the effects of the physical and chemical treatments on the surface of the interlayer insulating film.

Here, in not only the present embodiment but also embodiments 1 through 5, after contact hole section 11 is formed on interlayer insulating film 10 and passivation film 16, the photoresist layer is newly provided so as to cover the whole surface of interlayer insulating film 10 other than contact hole 11, and the physical and chemical surface treatments are performed so that only the contact hole can be cleaned.

Here, the aforementioned embodiments 1 through 5 describe the case where amorphous silicon is used as a semiconductor layer, but polycrystalline silicon may be used.

As mentioned above, the TFT array substrates for a liquid crystal display apparatus obtained by embodiments 2 through 5 are used so that the liquid crystal display apparatus of the present invention can be obtained similarly to embodiment 1.

The method of producing a thin film transistor according to claim 1 of the present invention includes the steps of:

forming a thin film transistor by successively providing a gate electrode, gate insulating film, semiconductor layer, source electrode and drain electrode onto a transparent insulating substrate;

forming an interlayer insulating film made of transparent insulating synthetic resin film on the transparent insulating substrate with the surface of the interlayer insulating film being made to be flat so that a level difference portion due to the thin film transistor area; and providing a contact hole on the drain electrode of the interlayer insulating film so as to form a pixel electrode composed of a transparent conductive film on the interlayer insulating film so that the pixel electrode is electrically connected with the drain electrode through the contact hole. Since the method includes the step of after forming the contact hole section on the interlayer insulating film, giving a surface treatment for cleaning the surface of the contact hole to the surface of the substrate including the surface of the drain electrode on the lower portion, this method produces an effect that the electrical contact between the drain electrode and pixel electrode through the contact hole is satisfactory.

In the method of producing a thin film transistor according to claim 2, since the contact hole is provided on the connection electrode connected with the drain electrode, this method produces an effect that a degree of freedom of the layout design for the position of the contact portion is widened.

The method of producing a thin film transistor according to claim 3 further includes the step of applying the surface treatment to the whole surface of the interlayer insulating film other than the surface of the contact hole with the whole surface being covered with the photoresist after forming the contact hole section and removing the photoresist, so the method produces the effect that only the contact hole is cleaned without the effect on the surface of the interlayer insulating film other than the contact hole.

In the method of producing a thin film transistor according to claim 4, since the surface treatment is applied by one of the physical and chemical methods, this method produces the effect that the electric contact between the drain electrode and pixel electrode via the contact hole is satisfactory.

The method of producing a thin film transistor according to claim 5 uses at least one method selected from methods such as the oxygen plasma treatment, nitrogen plasma treatment, helium plasma treatment, nitrogen ion implantation, phosphorus ion implantation, boron ion implantation and hydrogen ion implantation as the surface treatment using the physical method, so this method produces the effect that the electric contact between the drain electrode and pixel electrode through the contact hole is satisfactory.

The method of producing a thin film transistor according to claim 6 uses the method of applying light-etching to the surface by dry etching using gas applicable to the drain electrode to be connected with the pixel electrode as the surface treatment by the physical method, so this method produces the effect that the surface of the contact portion can be cleaned securely.

The method of producing a thin film transistor according to claim 7 uses a method in which the method of claim 5 is combined with the method of claim 6 as the surface treatment by the physical method, so this method produces the effect that the surface of the contact portion can be cleaned securely.

The method of producing a thin film transistor according to claim 8 uses the method of applying light-etching to the surface with chemical agent applicable to the drain electrode to be connected with the pixel electrode as the surface treatment by the chemical method, so this method produces the effect that the surface of the contact portion can be cleaned securely.

In the method of producing a thin film transistor according to claim 9, in a thickness of the drain electrode, a thickness of the portion which is electrically connected with the pixel electrode through the contact hole in the interlayer insulating film made of the transparent insulating synthetic resin is thinner than a thickness of the other portion, so this method produces the effect that the electric contact between the drain electrode and pixel electrode through the contact hole is satisfactory and that the surface of the contact portion can be cleaned securely.

In the method of producing a thin film transistor according to claim 10, in a thickness of the connection electrode, a thickness of the portion which is electrically connected with the pixel electrode through the contact hole in the interlayer insulating film made of the transparent insulating synthetic resin is thinner than a thickness of the other portion, so this method produces the effect that the electric contact between the drain electrode and pixel electrode through the contact hole is satisfactory and that the surface of the contact portion can be cleaned securely.

The method of producing a thin film transistor according to claim 11 further includes the step of after forming the transparent conductive film, forming the pixel electrode by patterning after a heat treatment is applied at a temperature which is not less than a temperature of depositing the transparent conductive film, so this method produces a method which further increases the effect that the electric contact between the drain electrode and pixel electrode through the contact hole is satisfactory.

In the method of producing a thin film transistor according to claim 12, the temperature of the heat treatment applied to the transparent conductive film is 150° C. to 250° C., so this method produces a method which further increases the effect that the electric contact between the drain electrode and pixel electrode through the contact hole is satisfactory.

The method of producing a thin film transistor according to claim 13 further includes the step of before forming the interlayer insulating film, forming a silicon nitride film which protects the channel section of the thin film transistor, and the step of forming the contact hole in the silicon nitride film on a portion of the drain electrode to be electrically connected with the pixel electrode, so this method produces effects that the electric contact between the drain electrode and pixel electrode through the contact hole is satisfactory and that the characteristic of TFT is improved and stabilized.

The method of producing a thin film transistor according to claim 14 further includes the steps of before forming the interlayer insulating film, forming a silicon nitride film which protects the channel section of the thin film transistor, and the step of forming the contact hole in the silicon nitride film on a portion of the connection electrode to be electrically connected with the pixel electrode, so this method produces effects that the electric contact between the drain electrode and pixel electrode through the contact hole is satisfactory and that the characteristic of TFT is improved and stabilized and that a degree of freedom of layout design for the position of the contact portion is widened.

The method of producing a thin film transistor according to claim 15 further includes the step of before forming the interlayer insulating film, forming a silicon nitride film which protects the channel section of the thin film transistor, the step of forming the interlayer insulating film, the step of forming the contact hole in the interlayer insulating film on a portion of the drain electrode to be electrically connected with the pixel electrode, and the step of forming the contact hole in the silicon nitride film by using the interlayer insulating film after forming the contact hole as a mask, so this method produces an effect that the contact hole can be formed simply without forming a new photoresist mask.

The method of producing a thin film transistor according to claim 16 further includes the step of before forming the interlayer insulating film, forming a silicon nitride film which protects the channel section of the thin film transistor, the step of forming the interlayer insulating film, the step of forming the contact hole in the interlayer insulating film on a portion of the connection electrode to be electrically connected with the pixel electrode, and the step of forming the contact hole in the silicon nitride film by using the interlayer insulating film after forming the contact hole as a mask, so this method produces the effects that a degree of freedom of the layout design for the position of the contact portion is widened and that the contact hole can be formed simply without forming a new photoresist mask.

In the method of producing a thin film transistor according to claim 17, the drain electrode is composed of at least one material selected from Al, Cr, Cu, Mo and Ta or metal alloy including at least two of the metals, and the pixel electrode is composed of at least one material selected from indium oxide, tin oxide and ITO, so this method produces effects that the wiring resistivity and the contact resistivity are lowered and that the quality of the TFT array is improved.

In the method of producing a thin film transistor according to claim 18, the connection electrode is composed of at least one material selected from Al, Cr, Cu, Mo and Ta or metal alloy including at least two of the metals, and the pixel electrode is composed of at least one material selected from indium oxide, tin oxide and ITO, so this method produces effects that a degree of freedom of the layout design for the position of the contact portion is widened, the wiring resistivity and the contact resistivity are lowered and that the quality of the TFT array is improved.

In the liquid crystal display apparatus according to claim 19 of the present invention, the thin film transistor according to claim 1 includes a transparent insulating substrate formed in a matrix pattern on the vicinity of the cross section of the gate wiring and source wiring, and a counter substrate which is provided with at least a counter electrode and color filter and which sandwiches liquid crystal with the transparent insulating substrate, so this produces an effect that a liquid crystal display apparatus with high aperture ratio and high performance, in which the pixel electrode is made to be flat by the interlayer insulating film and the electric contact between the drain electrode and pixel electrode is satisfactory, is obtained.

It should be understood that the apparatus and methods which have been shown and described herein are illustrative of the invention and are not intended to be limitative thereof. Clearly, those skilled in the art may conceive of variations or modifications to the invention. However, any such variations or modifications which falls within the purview of this description are intended to be included therein as well. The scope of the invention is limited only by the claims appended hereto.

What is claimed is:

1. A method for producing a thin film transistor, comprising the steps of:

forming a gate electrode, a gate insulating film, a semiconductor layer, a source electrode and a drain electrode on a transparent insulating substrate;

applying a transparent insulating synthetic resin having an upper flat surface onto said thin film transistor, thereby forming an interlayer insulating film and eliminating a level difference of said thin film transistor;

providing a contact hole, thereby exposing a part of the surface of said drain electrode; and forming a pixel electrode comprising a transparent conductive film on said interlayer insulating film so that said pixel electrode is electrically connected with said drain electrode through said contact hole on a contact surface;

applying a surface treatment to an entire surface of said interlayer insulating film, thereby removing a photoresist residue from said contact hole.

2. The method according to claim 1, wherein said surface treatment is a physical surface treatment or a chemical surface treatment.

3. The method of claim 2, wherein said physical surface treatment is at least one treatment selected from the group consisting of oxygen plasma treatment, nitrogen plasma treatment, helium plasma treatment, nitrogen ion implantation and phosphorus ion implantation.

4. The method of claim 2, wherein said physical surface treatment is dry etching using a gas.

5. The method of claim 2, wherein at least one surface treatment selected from the group consisting of oxygen plasma treatment, nitrogen plasma treatment, helium plasma treatment, nitrogen ion implantation and phosphorus ion implantation is combined with dry etching using a gas.

6. The method of claim 2, wherein said chemical surface treatment comprises:

applying light-etching with a chemical agent to said entire surface.

7. A method for producing a thin film transistor, comprising the steps of:

forming a gate electrode, a gate insulating film, a semiconductor layer, a source electrode and a drain electrode on a transparent insulating substrate;

applying a transparent insulating synthetic resin having an upper flat surface onto said thin film transistor, thereby forming an interlayer insulating film and eliminating a level difference of said thin film transistor;

providing a contact hole, thereby exposing a part of the surface of said drain electrode; and forming a pixel electrode comprising a transparent conductive film on said interlayer insulating film so that said pixel electrode is electrically connected with said drain electrode through said contact hole on a contact surface;

wherein a thickness of a part of said drain electrode which is electrically connected with said pixel electrode through said contact hole in said interlayer insulating film is thinner than a thickness of a remaining part of said drain electrode.

8. The method of claim 7, wherein said pixel electrode is electrically connected with said drain electrode trough said contact hole via a connection electrode.

9. The method of claim 8, wherein a thickness of a part of said connection electrode which is electrically connected with said pixel electrode through said contact hole in said interlayer insulating film is thinner than a thickness of a remaining part of said connection electrode.

10. The method of claim 7, further comprising:

applying a surface treatment to an entire surface of said interlayer insulating film, thereby removing a photoresist residue from said contact hole.

11. The method of claim 10, wherein said surface treatment is a physical surface treatment or a chemical surface treatment.

12. The method of claim 11, wherein said physical surface treatment is at least one treatment selected from the group consisting of oxygen plasma treatment, nitrogen plasma treatment, helium plasma treatment, nitrogen ion implantation and phosphorus ion implantation.

13. The method of claim 11, wherein said physical surface treatment is dry etching using a gas.

14. The method of claim 11, wherein said surface treatment is selected from the group consisting of oxygen plasma treatment, nitrogen plasma treatment, helium plasma treatment, nitrogen ion implantation and phosphorus ion implantation is combined with dry etching using a gas.

15. The method of claim 11, wherein said chemical surface treatment comprises:

applying light-etching with a chemical agent to said entire surface.

16. The method of claim 7, further comprising:

after forming said transparent conductive film, forming said pixel electrode by patterning after a heat treatment is applied at a temperature which is not less than a temperature at which said transparent conductive film is deposited.

17. The method of claim 16, wherein said temperature of said heat treatment applied to said transparent conductive film is 150° C. to 250° C.

18. The method of claim 7, further comprising:

before forming said interlayer insulating film, forming a silicon nitride film which protects a channel section of said thin film transistor; and forming said contact hole in said silicon nitride film on a portion of said drain electrode to be electrically connected with said pixel electrode.

19. The method of claim 8, further comprising:

before forming said interlayer insulating film, forming a silicon nitride film which protects a channel section of said thin film transistor; and forming said contact hole in said silicon nitride film on a portion of said connection electrode to be electrically connected with said pixel electrode.

20. The method of claim 7, further comprising:

before forming said interlayer insulating film, forming a silicon nitride film which protects a channel section of said thin film transistor;

forming said interlayer insulating film;

forming said contact hole in said interlayer insulating film on a portion of said drain electrode to be electrically connected with said pixel electrode; and forming said contact hole in said silicon nitride film by using said interlayer insulating film after forming said contact hole as a mask.

21. The method of claim 8, further comprising:

before forming the interlayer insulating film, forming a silicon nitride film which protects a channel section of said thin film transistor;

forming said interlayer insulating film;

forming said contact hole in said interlayer insulating film on a portion of said connection electrode to be electrically connected with said pixel electrode; and forming said contact hole in said silicon nitride film by using said interlayer insulating film after forming said contact hole as a mask.

22. The method of claim 7, wherein said drain electrode comprises at least one material selected from Al, Cr, Cu, Mo and Ta or a metal alloy including at least two of said metals, and said pixel electrode comprises at least one material selected from indium oxide, tin oxide and ITO.

23. The method of claim 8, wherein said connection electrode comprises at least one material selected from Al, Cr, Cu, Mo and Ta or a metal alloy including at least two of said metals, and said pixel electrode comprises at least one material selected from indium oxide, tin oxide and ITO.

24. A liquid crystal display apparatus comprising a transparent insulating substrate formed in a matrix pattern on a vicinity of a cross section of a gate wiring and source wiring, a counter substrate which is provided with at least one counter electrode and a color filter and which sandwiches a liquid crystal with said transparent insulating substrate, and a TFT manufactured by a method, comprising the steps of:

forming a gate electrode, a gate insulating film, a semiconductor layer, a source electrode and a drain electrode on a transparent insulating substrate;

applying a transparent insulating synthetic resin having an upper flat surface, thereby forming an interlayer insulating film and eliminating a level difference of said thin film transistor; and providing a contact hole, thereby exposing a part of the surface of said drain electrode;

forming a pixel electrode composed of a transparent conductive film on said interlayer insulating film so that said pixel electrode is electrically connected with said drain electrode through said contact hole on a contact surface.

25. A method for producing a thin film transistor comprising a drain electrode, comprising:

forming a part of said drain electrode which is electrically connected with a pixel electrode such that said part of said drain electrode is thinner than a thickness of a remaining part of said drain electrode.

* * * * *